(12) United States Patent  
Luo

(10) Patent No.: US 7,525,347 B1  
(45) Date of Patent: Apr. 28, 2009

(54) DIFFERENTIAL PEAK DETECTOR

(75) Inventor: Qiang Luo, Milpitas, CA (US)

(73) Assignee: Marvell International Ltd., Hamilton (BM)

( * ) Notice: Subject to any disclaimer, the term of this patent is extended or adjusted under 35 U.S.C. 154(b) by 28 days.

(21) Appl. No.: 11/974,853

(22) Filed: Oct. 15, 2007

Related U.S. Application Data

(60) Provisional application No. 60/862,260, filed on Oct. 20, 2006.

(51) Int. Cl.  
*H03K 5/153* (2006.01)

(52) U.S. Cl. .................... 327/58; 327/62; 327/66; 327/67

(58) Field of Classification Search .............. 327/58–62  
See application file for complete search history.

(56) References Cited

U.S. PATENT DOCUMENTS

| | | | | |
|---|---|---|---|---|
| 5,187,448 | A | | 2/1993 | Brooks et al. ............... 330/258 |
| 5,324,994 | A | * | 6/1994 | Sullivan et al. .............. 327/58 |
| 5,331,210 | A | * | 7/1994 | McCarroll ................... 327/58 |
| 5,828,240 | A | * | 10/1998 | Smith ......................... 327/62 |
| 6,064,262 | A | | 5/2000 | Wang ......................... 330/253 |
| 6,956,905 | B1 | | 10/2005 | Rokhsaz ..................... 375/257 |
| 7,053,674 | B1 | | 5/2006 | Romero et al. ................ 327/94 |

OTHER PUBLICATIONS

Zhak, Serhii M. et al., "A Low-Power Wide Dynamic Range Envelope Detector", IEEE Journal Of Solid-State circuits, vol. 38, No. 10, Oct. 2003.

Abdalla, Hisham et al., "An Analog VLSI Low-Power Envelope Periodicity Detector", IEEE Transactions On Circuits And Systems, vol. 52, No. 9, Sep. 2005.

Ericson, M.N. et al., "A Low-Power, CMOS Peak Detect And Hold Circuit For Nuclear Pulse Spectroscopy", IEEE Nuclear Science Symposium, Norfolk VA, Oct. 31-Nov. 5, 1994.

De Geronimo, Gianluigi, et al., "Analog Peak Detector and Derandomizer for High-Rate Spectroscopy", IEEE Transactions On Nuclear Science, vol. 49, No. 4, Aug. 2002.

Meyer, Robert G., "Low-Power Monolithic RF Peak Detector Analysis", IEEE Journal Of Solid-State Circuits, vol. 30, No. 1, Jan. 1995.

Nagaraj, Krhishnaswamy et al. "A Median Peak Detecting Analog Signal Processor for Hard Disk Drive Servo", IEEE Journal Of Solid-State Circuits, vol. 30, No. 4, Apr. 1995.

Palojarvi, Pasi et al., A 250-MHz BiCMOS Receiver Channel With Leading Edge Timing Discriminator for a Pulsed Time-of-Flight Laser Rangefinder, Jun. 2005.

Sato, Takashi et al., "Accurate In Situ Measurement of Peak Noise and Delay Change Induced by Interconnect Coupling", IEEE Journal Of Solid-State Circuits, vol. 36, No. 10, Oct. 2001.

* cited by examiner

*Primary Examiner*—Long Nguyen

(57) ABSTRACT

Differential peak detection for outputting a signal indicative of a peak value of an input signal. The input signal is differentially amplified using common mode feedback and a common mode output is thereby output, wherein common mode level of the common mode output is substantially the same as a common mode voltage. The common mode output of such differential amplification is coupled to an input of a first common source input pair, and the common mode voltage and a feedback from the output signal across a sampling capacitor is coupled to an input of a second common source input pair. A summation of respective outputs of the first and second common source input pairs is coupled to an input of a transconductance stage, wherein an output of the transconductance stage controls charging of the sampling capacitor. In this manner, a more accurate output signal is provided.

17 Claims, 10 Drawing Sheets

DIFFERENTIAL PEAK DETECTOR

CROSS-REFERENCE TO RELATED APPLICATION

This application claims the benefit of U.S. Provisional Patent Application No. 60/862,260, filed Oct. 20, 2006, the contents of which are hereby incorporated by reference as if fully stated herein.

FIELD OF THE INVENTION

The present invention relates to a detector for detecting a peak level of a voltage signal used in an apparatus.

BACKGROUND OF THE INVENTION

In processing signals used by an electronic apparatus, it is often useful to detect the peak level of a signal. This is particularly true of an electrical apparatus that is designed to read and write signals to and from a data storage medium, such as, for example, a DVD read/write device. For such apparatuses, it is important that signal peaks are accurately detected.

A peak detector is an analog circuit adapted to detect the peak levels of a signal. Conventional peak detectors detect single-end peaking signals by charging or discharging a sampling capacitor.

However, the accuracy of conventional peak detectors is limited, since the single-end peak detector architecture suffers from a low signal-to-noise ratio. Moreover, the output of conventional peak detectors is sensitive to input signal DC level variation caused by power supply variation and other noise sources. As illustrated in FIG. 1, changes in the DC level of the input signal cause the output to change. Furthermore, conventional peak detectors suffer from undesirable feed-forward noise, which corrupts the output signal when the input signal continues to change, due to capacitance coupling.

FIG. 2 is used to explain these drawbacks in greater detail. FIG. 2 shows a single-end peak detector 100 that has an amplifier 110, PMOS pair 120, sampling capacitor 130, and reset switch 140. PMOS pair 120 charges sampling capacitor 130. Reset switch 140 resets sampling capacitor 130 by providing sampling capacitor 130 with reset signal 150. The NMOS input pair formed by NMOS transistors 111 and 112 (shown in FIG. 3) are used in amplifier 110 to sense the input and output. When the output is lower than the input, amplifier 110 enables PMOS pair 120 to charge sampling capacitor 130. When the output reaches peak value, amplifier 110 shuts off PMOS pair 120 and the output is held at the peak value.

When the output has reached the peak, the input is still varying. This variation is coupled to the output through the parasitical gate-to-source capacitance of NMOS transistors 111 and 112. C1 and C2 are gate-to-source parasitical capacitors of NMOS transistors 111 and 112, respectively. The coupling effect from input to output can be represented by Equation (1):

$$\Delta V_{out} \approx \Delta V_{in} \cdot \frac{C1 + C2}{C1 + C2 + Csmp} \quad (1)$$

Equation (1) shows that when input variation is large, or parasitical capacitor C1 and C2 are large, the output variation will be large. Moreover, this output variation is signal dependent, which results in significant nonlinearity and affects the down stream sampling circuits.

FIG. 4 illustrates the effects of parasitical capacitance. Changes in input signal 403 are coupled the output, resulting in an output signal 402 that varies from the peak value 401.

SUMMARY OF THE INVENTION

The present invention addresses these difficulties by providing differential peak detection for detecting the peak level of a signal used by an electrical apparatus such as, for example, an apparatus designed to read and write signals to and from a data storage medium. The invention herein is particularly useful in situations where accurate detection of peak levels is needed. The invention herein is also adapted to sense single-end, differential, positive peaking, and/or negative peaking input signals.

Thus, in one aspect, the invention provides differential peak detection for outputting an output signal indicative of a peak value of an input signal, wherein the output signal is provided across a sampling capacitor. The input signal is differentially amplified using common mode feedback and a common mode output is thereby output, wherein common mode level of the common mode output is substantially the same as a common mode voltage. The common mode output of such differential amplification is coupled to an input of a first common source input pair, and the common mode voltage and a feedback from the output signal across the sampling capacitor is coupled to an input of a second common source input pair. Respective outputs of the first and second common source input pairs are coupled to an input of a transconductance stage, wherein an output of the transconductance stage controls charging of the sampling capacitor.

Because the differential amplification of the input signal uses common mode feedback to output a common mode output whose common mode level is substantially the same as a common mode voltage, the invention provides an output signal that is minimally affected by DC level shifting. Furthermore, because the common mode output of the differential amplification is coupled to an input of the first common source input pair, and because the common mode voltage and feedback from the output signal is coupled to an input of the second common source input pair, output signal corruption due to capacitance coupling is reduced. This result is achieved because signal variation in the differential common mode output tends to cancel at the input of the first common source input pair, and because the common mode voltage approximates a constant voltage that exhibits minimal signal variation. Therefore, by reducing input signal variation that is coupled to the output through capacitance coupling, the invention provides a more accurate output signal.

In another aspect, the invention includes outputting the input signal for differential amplification using a multiplexer (MUX). A MUX signal and a common mode voltage are input, and a differential signal for differential amplification is output. A differential signal is output from single-end positive peaking signals, single-end negative peaking signals, differential positive peaking signals, and differential negative peaking signals.

By outputting a differential signal for differential amplification, the multiplexer provides the advantage of a high signal-to-noise ratio because noise coupled to the signal cancels out. For example, the multiplexer outputs a positive output and a negative output for an input signal. Noise in the input signal is duplicated in both the positive output and the negative output. During differential amplification, the noise in both the positive output and the negative outputs are canceled.

In preferred aspects of the invention, respective outputs of the first and second common source input pairs are added through addition of current, wherein currents of positive outputs of the first and second common source input pairs flow through a positive input of the transconductance stage, and currents of negative outputs of the first and second common source input pairs flow through a negative input of said transconductance stage. The first and second common source input pairs include NMOS input pairs. The transconductance stage comprises an NMOS input pair, and the transconduction stage drives a current mirror which provides a charging current for charging the sampling capacitor.

This brief summary has been provided so that the nature of the invention may be understood quickly. A more complete understanding of the invention can be obtained by reference to the following detailed description of the preferred embodiment thereof in connection with the attached drawings.

DETAILED DESCRIPTION OF THE PREFERRED EMBODIMENT

Figure 5:
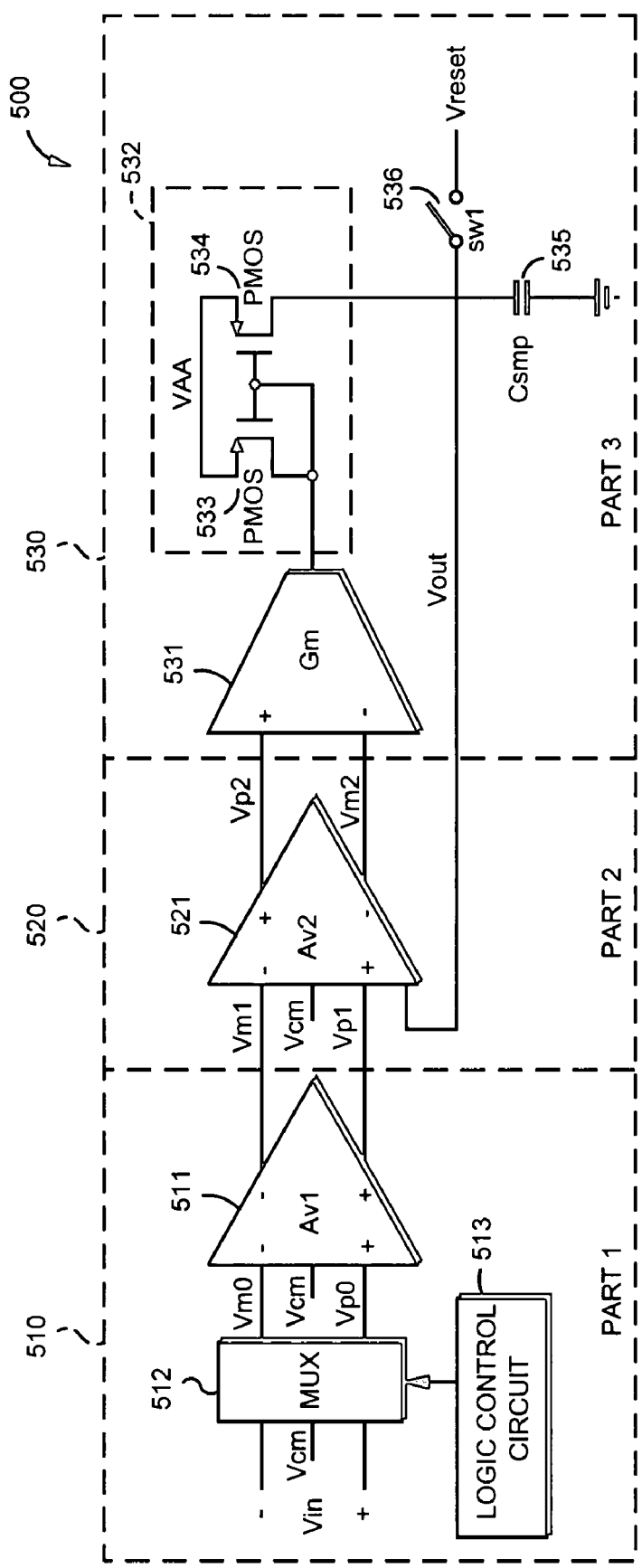
FIG. 5 is a block diagram of a differential peak detector, in accordance with a preferred embodiment of the invention.

FIG. 5 is a block diagram of a differential peak detector according to a preferred embodiment of the invention. Differential peak detector 500 is constructed from three fundamental components: differential amplifier 511, differential amplifier 521, and transconductor amplifier 531. Differential amplifier 511 is constructed to differentially amplify an input signal and output a common mode output whose common mode level is substantially the same as a common mode voltage. Differential amplifier 521 is constructed to output a difference between the common mode output of differential amplifier 511 and a feedback from the output signal across sampling capacitor 535. Transconductor amplifier 531 is constructed to control charging of sampling capacitor 535 based on the output of differential amplifier 521. More detailed explanations are provided hereinbelow.

Differential amplifier 511 forms stage 510 of differential peak detector 500, along with MUX 512 and logic control circuit 513. Differential amplifier 511 has common mode feedback, a gain approximating one, and a high bandwidth. The differential output of differential amplifier 511 (i.e., "Vp1" and "Vm1") is coupled to a differential input of differential amplifier 521. Inputs of differential amplifier 511 are coupled to a differential output from MUX 512 (i.e., "Vp0" and "Vm0"), and a common mode voltage (i.e., "Vcm").

MUX 512 is a multiplexer for generating a differential input signal for differential amplifier 511 based on at least one of a single-end positive peaking signal, a single-end negative peaking, a differential positive peaking signal, and a differential negative peaking signal. MUX 512 has a signal input coupled to an input signal (i.e., "Vin"), a common mode voltage input coupled to the common mode voltage (i.e., "Vcm"), and a signal selection input coupled to logic control circuit 513. Logic control circuit 513 specifies a multiplexing mode by selecting the type of signals that are detected by the differential peak detector 500. The output of MUX 512 (i.e., "Vp0" and "Vm0") depends on the type of the input signal (i.e., "Vin") selected by logic control circuit 513, as shown in Table 1.

TABLE 1

| input and output of the MUX | | |
|---|---|---|
| Vin | Vp0 | Vm0 |
| Single-end positive peaking | Vin | Vcm |
| Single-end negative peaking | Vcm | Vin |
| Differential positive peaking | Vin+ | Vin− |
| Differential negative peaking | Vin− | Vin+ |

Figure 6B:
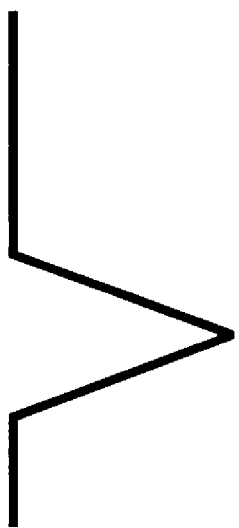
FIG. 6B is a waveform of a single-end negative peaking signal.
Figure 6D:
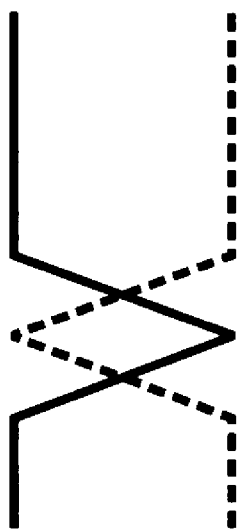
FIG. 6D is a waveform of a differential negative peaking signal.
Figure 6A:
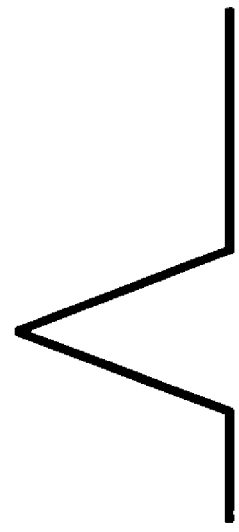
FIG. 6A is a waveform of a single-end positive peaking signal.
Figure 6C:
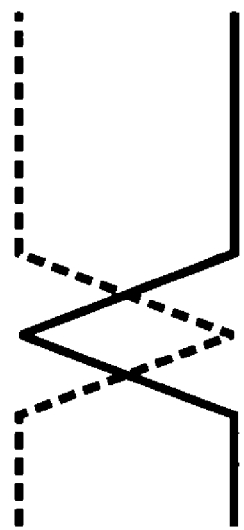
FIG. 6C is a waveform of a differential positive peaking signal.

In a first multiplexing mode, a single-end positive peaking signal (FIG. 6A) is detected, and the positive output (i.e., "Vp0") is the signal (i.e., "Vin"), and the negative output (i.e., "Vm0") is the common mode voltage (i.e., "Vcm"). In a second multiplexing mode, a single-end negative peaking signal (FIG. 6B) is detected, and the negative output (i.e., "Vm0") is the signal (i.e., "Vin"), and the positive output (i.e., "Vp0") is the common mode voltage (i.e., "Vcm"). In a third multiplexing mode, a differential positive peaking signal (FIG. 6C) is detected, and the positive output (i.e., "Vp0") is the positive component of the signal (i.e., "Vin+"), and the negative output (i.e., "Vm0") is the negative component of the signal (i.e., "Vin−"). In a fourth multiplexing mode, a differential negative peaking signal (FIG. 6D) is detected, and the positive output (i.e., "Vp0") is the negative component of the signal (i.e., "Vin−"), and the negative output (i.e., "Vm0") is the positive component of the signal (i.e., "Vin+").

Differential amplifier 521 forms stage 520 of differential peak detector 500. Transconductor amplifier 531, current mirror 532, sampling capacitor 535, and reset switch 536 form stage 530. Differential amplifier 521 has a bandwidth of, for example, at least approximately twice a dominant pole frequency of the input signal and gain of, for example, approximately 10 dB. The differential output of differential amplifier 521 (i.e., "Vp2" and "Vm2") is coupled to the inputs of transconductor amplifier 531. The output of transconductor amplifier 531 is coupled to current mirror 532.

In operation, reset switch 536 is initially closed to enable sampling capacitor 535 to be reset to an initial value (i.e., "Vreset"). The reset voltage (signal) is selected so as to be lower than the minimum peak value detector 500 is adapted to detect. After sampling capacitor 535 is fully charged to the reset voltage, switch 536 is opened. As a consequence, the difference between input voltage Vin and the voltage formed across sampling capacitor 535 (i.e., "Vout") is amplified by differential amplifier 521 which has a gain of Av2. The amplified differential output voltages Vp2 and Vm2, generated by amplifier 521 are supplied to transconductor amplifier 531 which, in response, generates a signal defined by the product of the transconductance (Gm) of transconductor amplifier 531 and the difference between the voltages Vp2 and Vm2.

If voltage Vout is less than Vin (track phase), the voltage generated by transconductor amplifier 531 is decreased, which in turn causes PMOS transistor 534 of current mirror 532 to rapidly charge sampling capacitor 535, thereby causing voltage Vout to increase. If voltage Vout is equal to, or slightly larger than, voltage Vin (hold phase), the voltage generated by transconductor amplifier 531 is increased, thereby shutting off PMOS transistors 533 and 534 so as to hold voltage Vout at the detected peak value.

Figure 7:
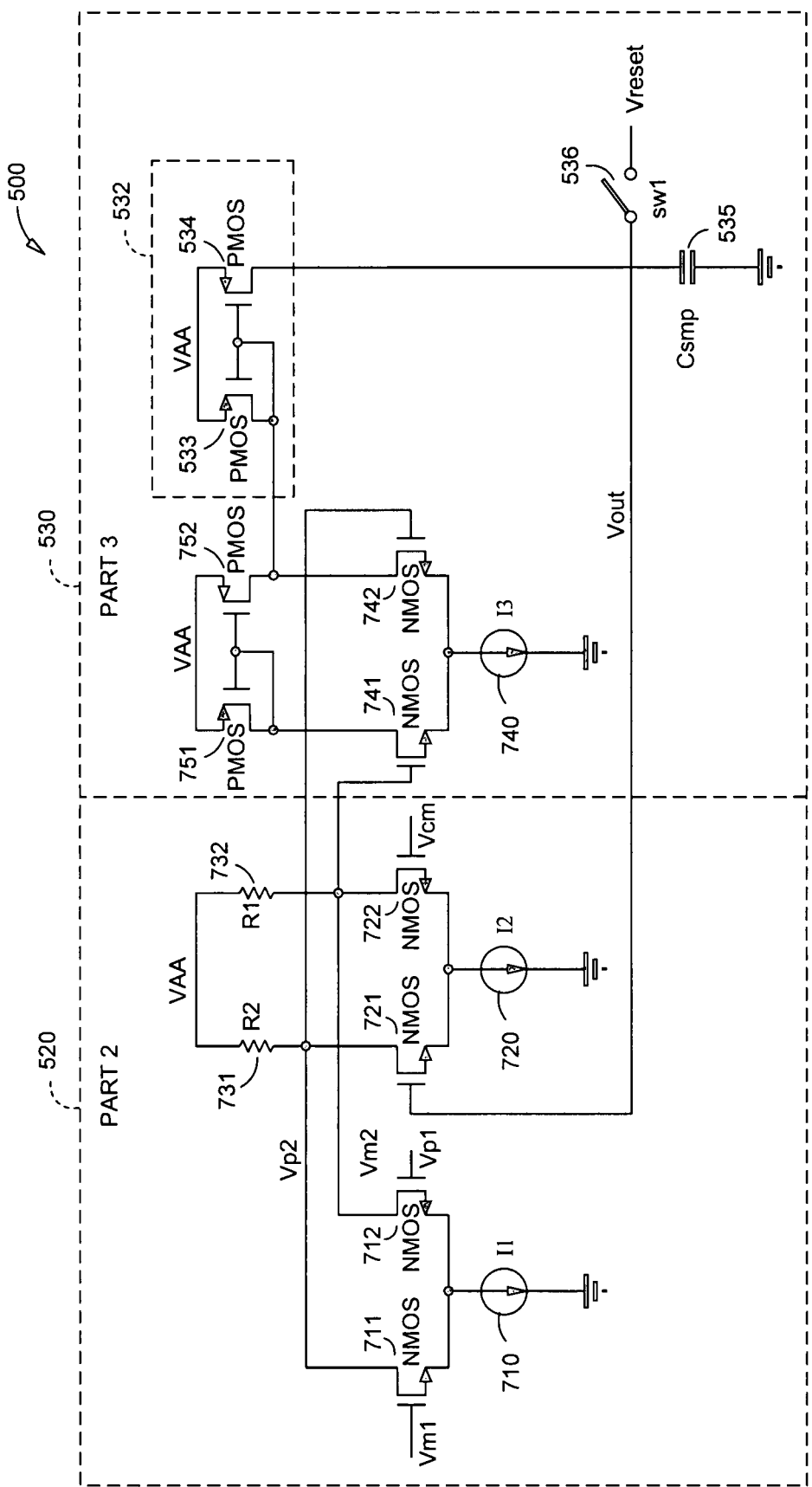
FIG. 7 is a schematic view of the differential peak detector of FIG. 5, in accordance with the preferred embodiment of the invention.

FIG. 7 is a schematic view of stages 520 and 530 of differential peak detector 500. Differential amplifier 521 is shown as including a first and second common source input pair. The first common source input pair is formed by NMOS input transistors 711 and 712, and current source 710. The input of transistor 711 is coupled to a negative input signal (i.e., "Vm1"), and the input of transistor 712 is coupled to a positive input signal (i.e., "Vp1"). The second common source input pair is formed by NMOS input transistors 721 and 722, and current source 720. The input of transistor 721 is coupled to the voltage formed across sampling capacitor 535 (i.e., "Vout"), and the input of transistor 722 is coupled to the common mode voltage (i.e., "Vcm"). The outputs of transistors 711 and 721 are coupled to loading resistor 731 and the input of NMOS transistor 742. The outputs of transistors 712 and 722 are coupled to loading resistor 732 and the input of NMOS transistor 741.

Transistors 711, 712, 721, and 722 are transistors having similar characteristics. The drain saturation voltage of transistors 711, 712, 721, and 722 should be large enough to cover the input signal peak range. Current sources 710 and 720 provide the same current, and loading resistors 731 and 732 have similar resistances. Loading resistors 731 and 732 can be composed of, for example, polysilicon, or any other suitable type of material. Loading resistors 731 and 732 provide a constant output common mode voltage for stage 530. The output common mode voltage supplied to stage 530 can be represented by Equation (2):

$$V_{cm\_out} = 0.5 \times (I_0 + I_1) \times R_1 \quad (2)$$

The outputs of the first and second common source input pairs are added through addition of current, wherein the current outputs of transistors 711 and 721 (whose sum is "Vp2") flow through the positive input of transconductor amplifier 531 (input of 742), and the current outputs of transistors 721 and 722 (whose sum is "Vm2") flow through the negative input of transconductor amplifier 531 (input of 741).

Transconductor amplifier 531 is shown as including a common source input pair formed by NMOS input transistors 741 and 742, PMOS transistors 751 and 752, and current source 740. The outputs of transistors 741 and 742 are coupled to PMOS transistors 751 and 752, respectively, which form an active load. The output of transistor 742 is also coupled to current mirror 532, which is formed by PMOS transistors 533 and 534.

At track phase, Vout is less than Vin, and there exists active current flowing through transistor 533, which generates mirror current at transistor 534 to charge sampling capacitor 535. At hold phase, Vout is greater than or equal to Vin, and the gate voltage of transistors 533 and 534 are raised to the supply voltage (i.e., "VAA"), and only subthreshold current flows through transistor 534. To minimize the subthreshold current effect, the peak detector output can be sampled again after the peak has been detected.

Figure 1:
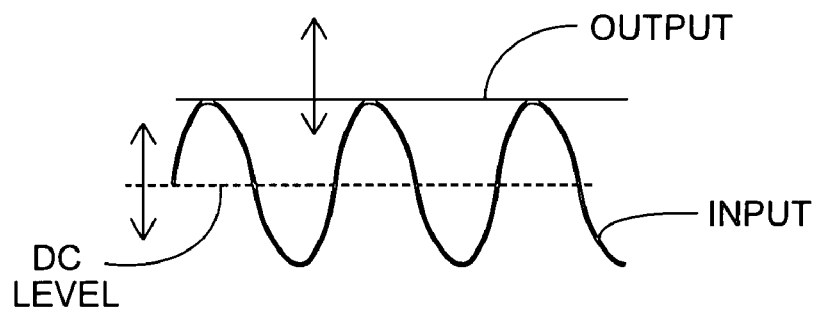
FIG. 1 is a waveform of an output signal of a single-end peak detector.
Figure 2:
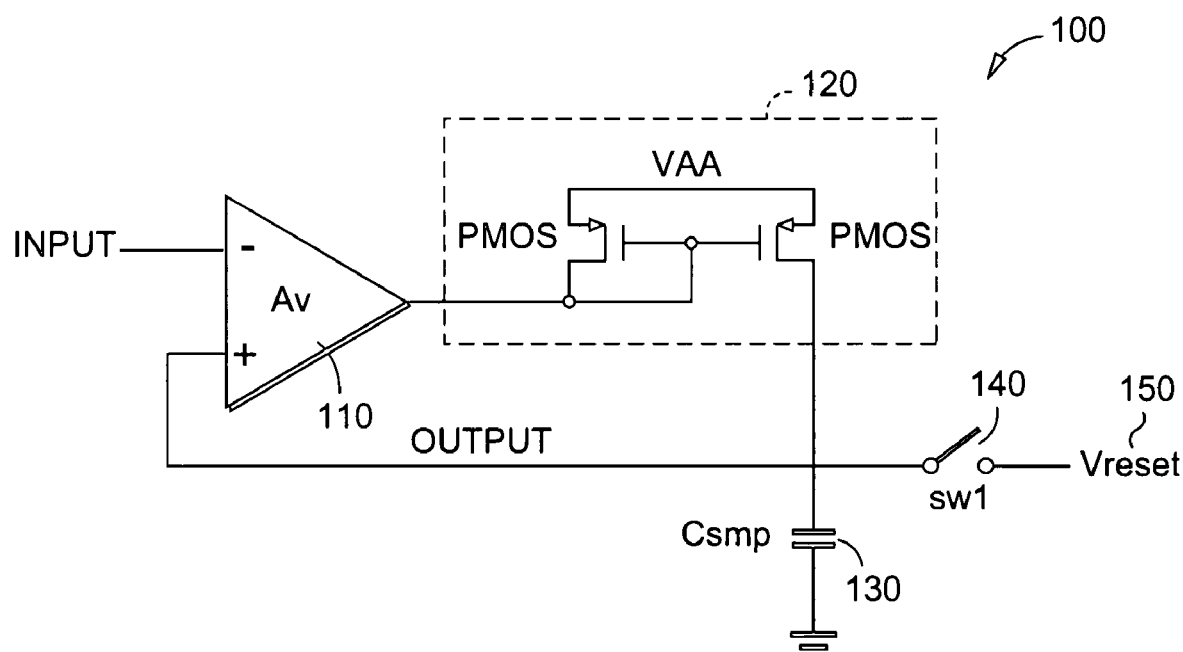
FIG. 2 is a block diagram of a single-end peak detector.
Figure 3:
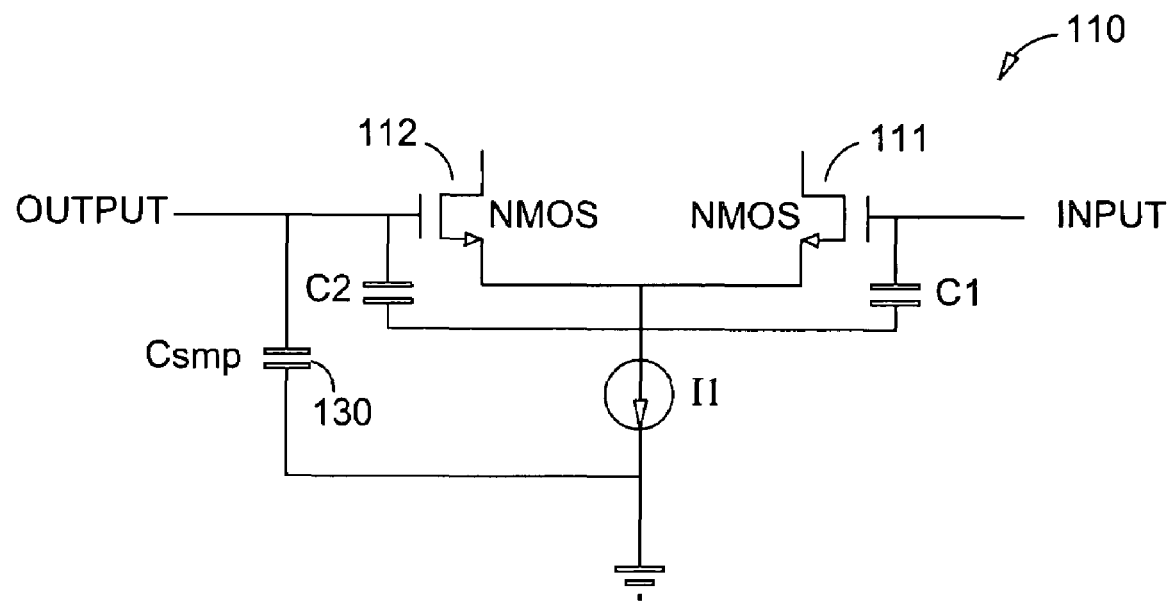
FIG. 3 is a schematic view of an amplifier of a single-end peak detector.
Figure 4:
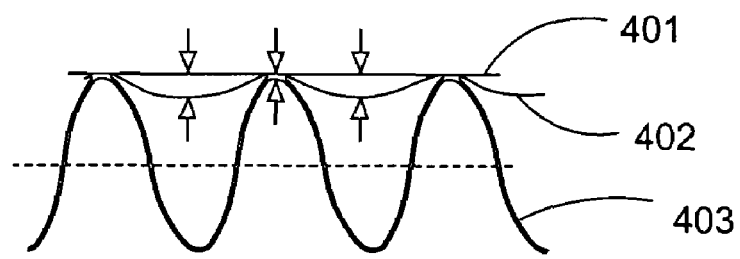
FIG. 4 is a waveform of an output signal of a single-end peak detector.
Figure 8:
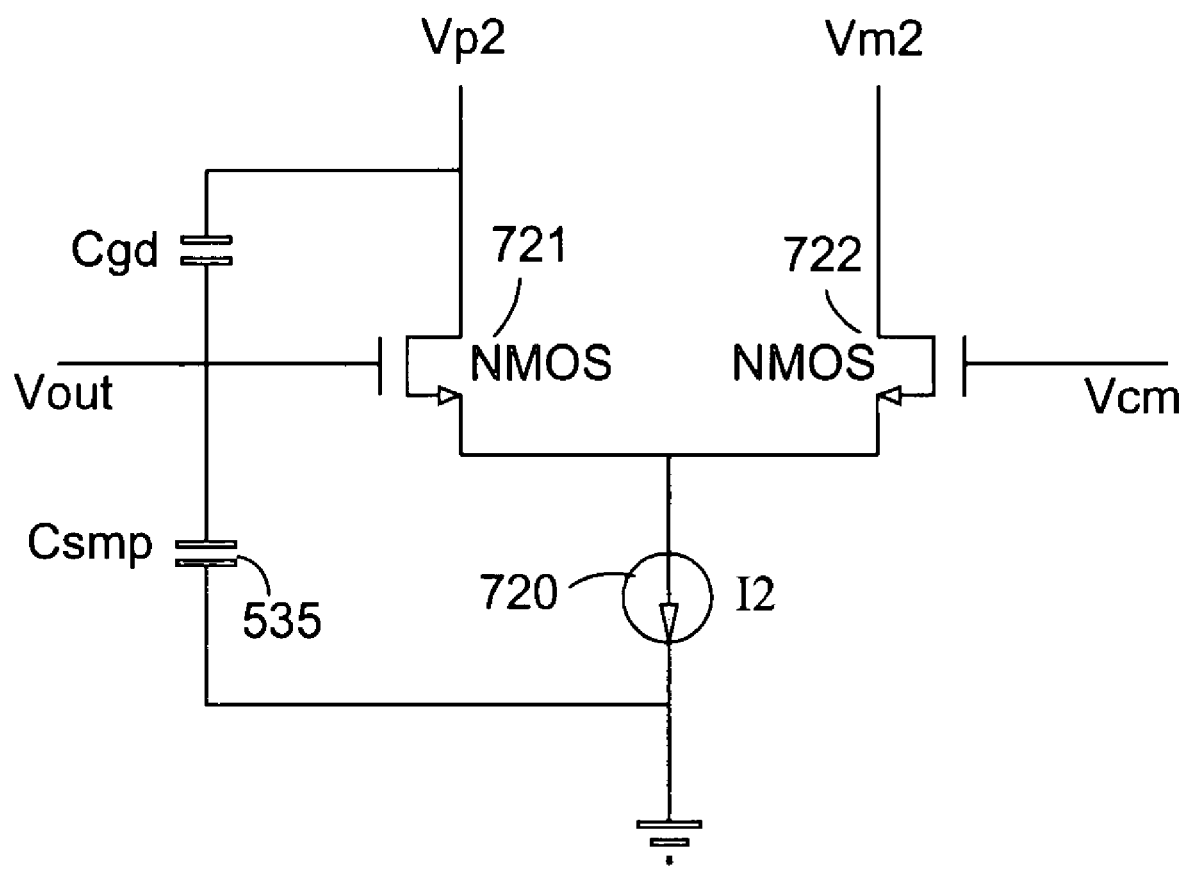
FIG. 8 is a partial schematic view of the differential peak detector of FIG. 5 depicting parasitical capacitance.
Figure 9A:
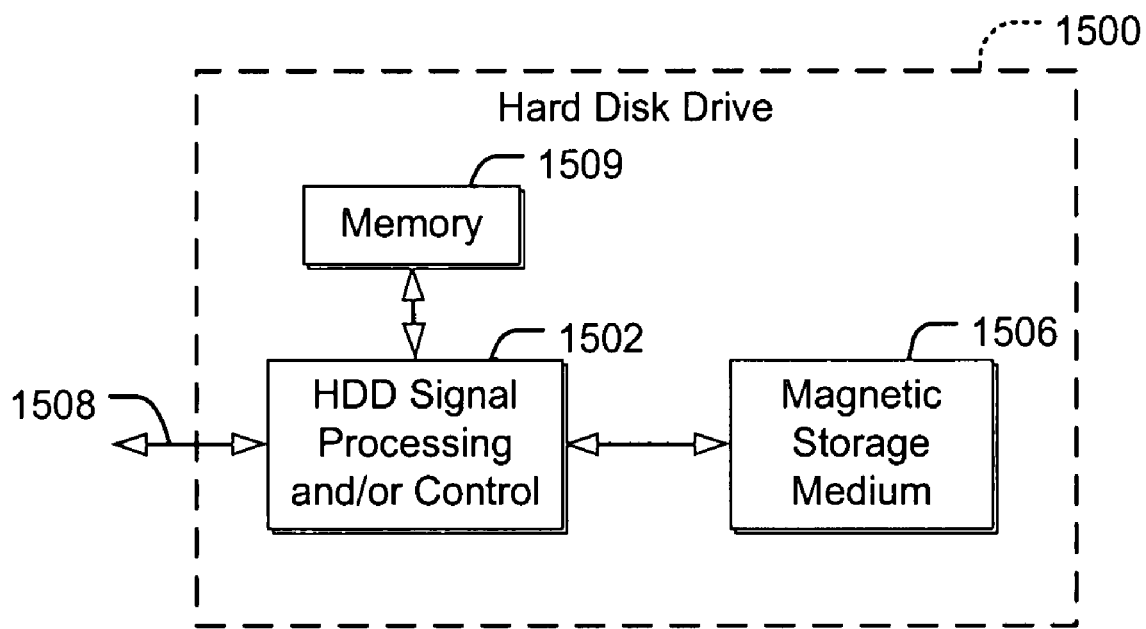
FIG. 9A is a block diagram showing an embodiment of the invention in a hard disk drive.
Figure 9B:
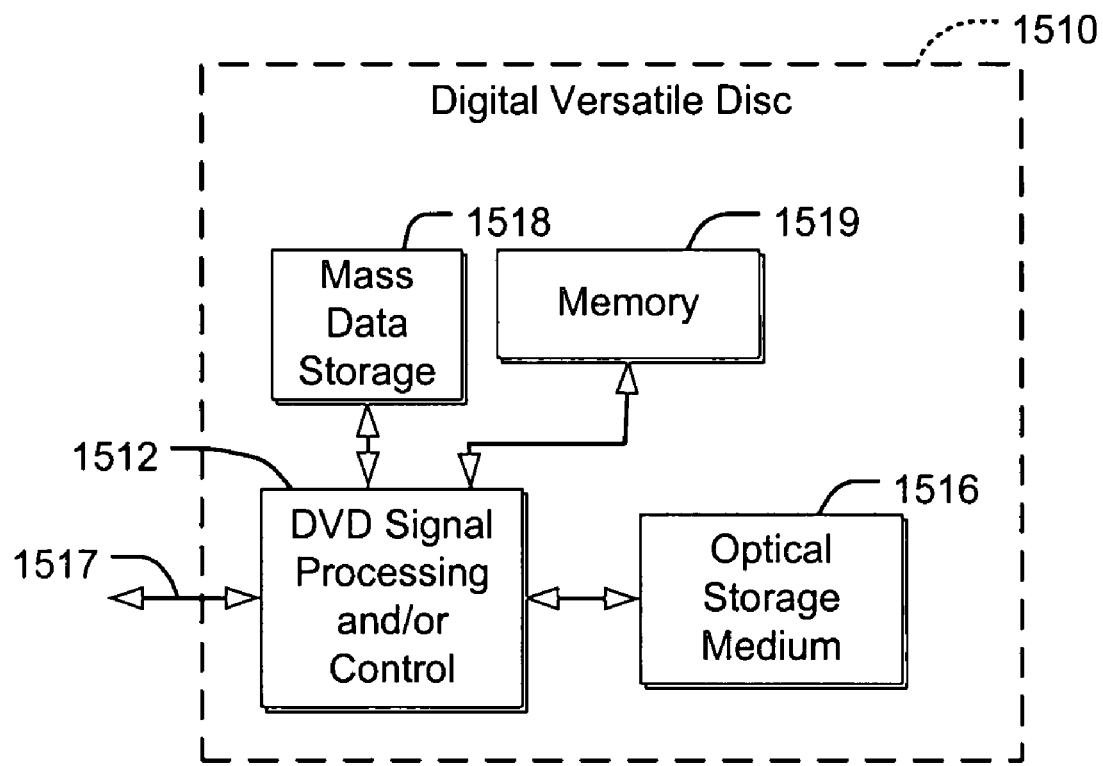
FIG. 9B is a block diagram of the invention in a DVD drive.
Figure 9C:
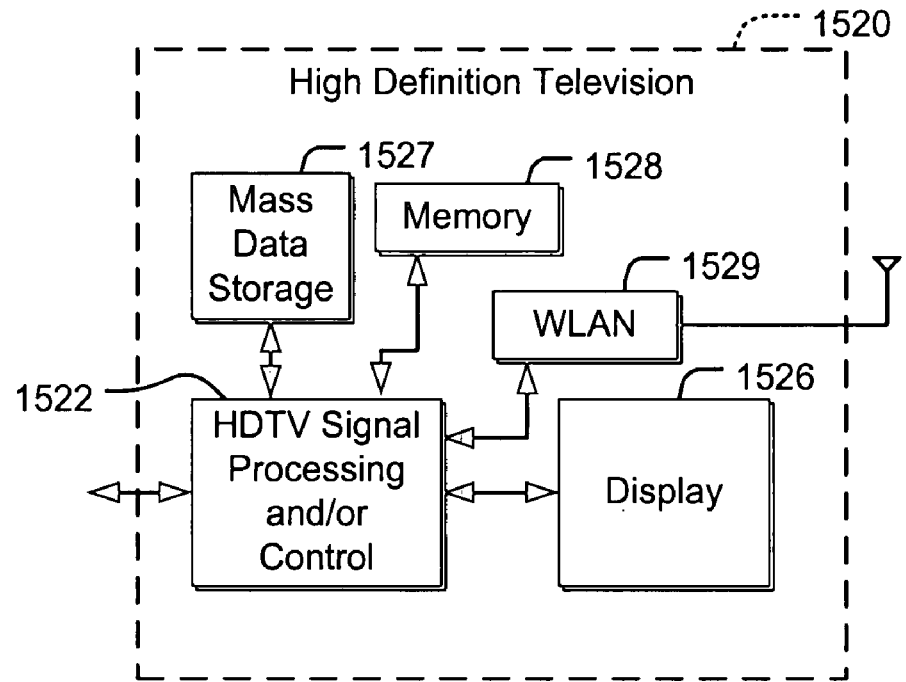
FIG. 9C is a block diagram of the invention in a high definition television (HDTV).
Figure 9D:
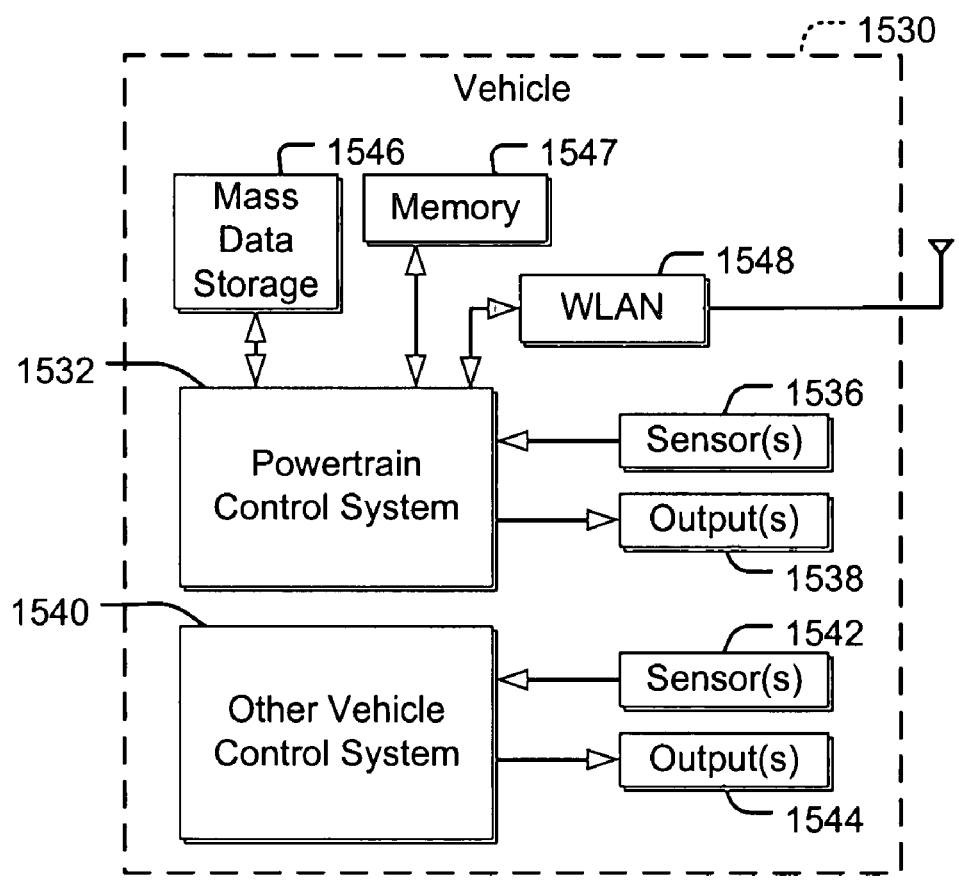
FIG. 9D is a block diagram of the invention in a vehicle control system.
Figure 9E:
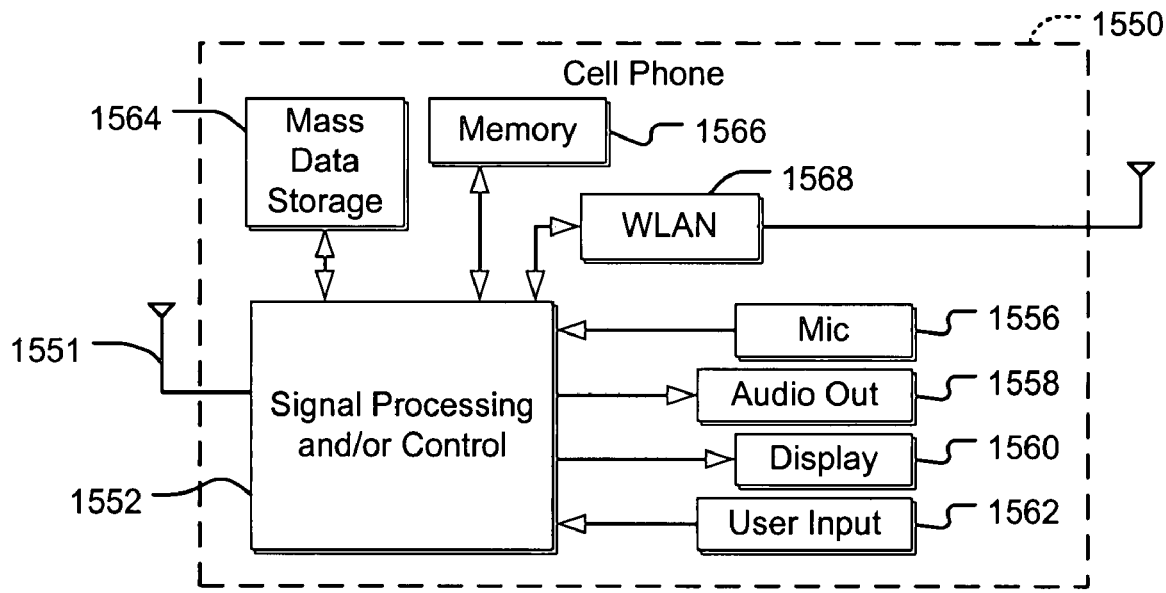
FIG. 9E is a block diagram of the invention in a cellular or mobile phone.
Figure 9F:
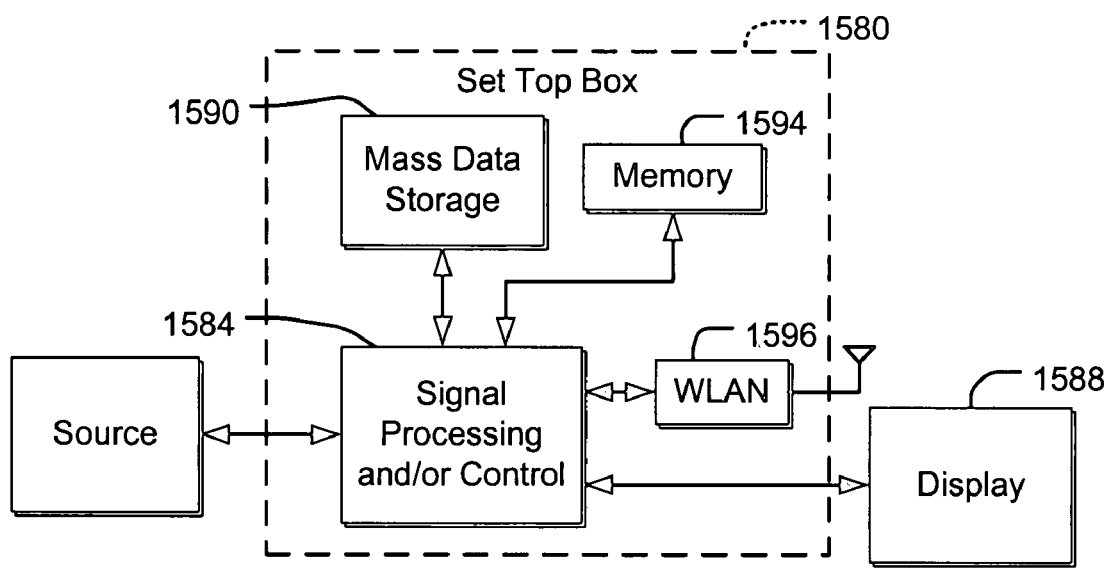
FIG. 9F is a block diagram of the invention in a set-top box (STB).
Figure 9G:
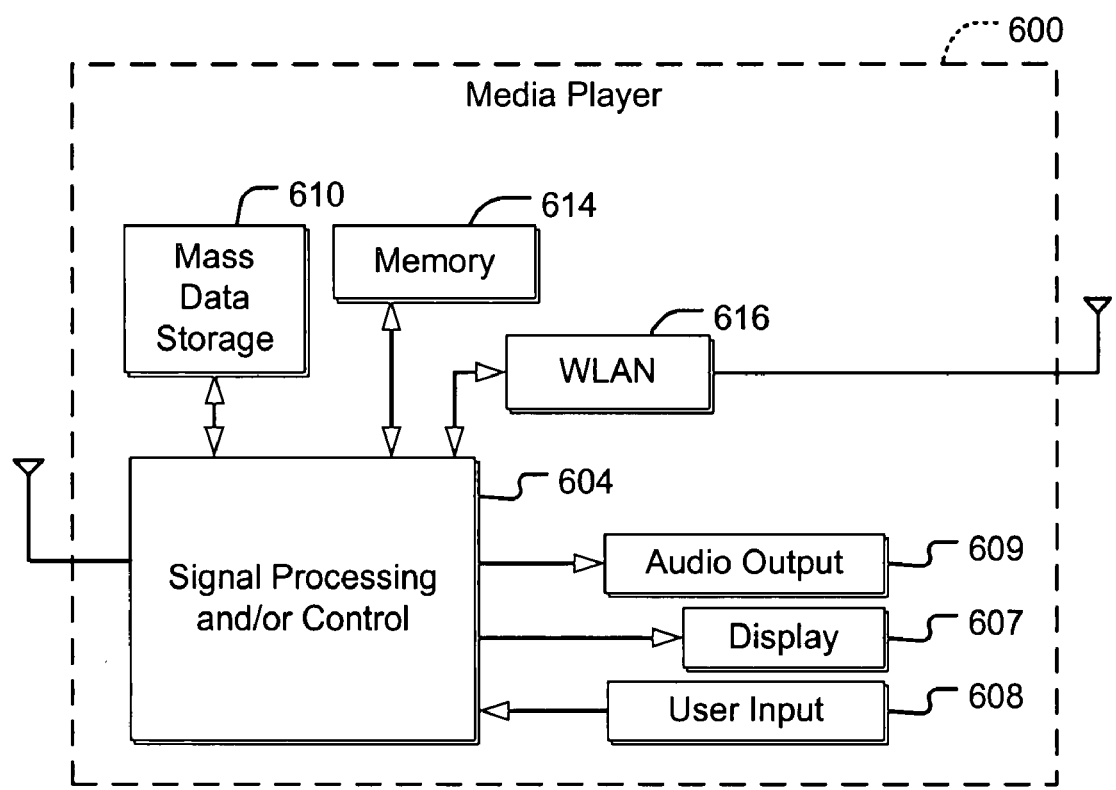
FIG. 9G is a block diagram of the invention in a media player.

Because the input of transistor 721 is coupled to the voltage formed across sampling capacitor 535 (i.e., "Vout") and the input of transistor 722 is coupled to the common mode voltage (i.e., "Vcm"), output signal corruption due to gate-to-source capacitance coupling is reduced. This result is achieved because the common mode voltage approximates a constant voltage that exhibits minimal signal variation. While variations in Vin may be coupled to Vout through parasitical gate-to-drain capacitance (i.e., "Cgd"), as shown in FIG. 9, the effect of this parasitical capacitance is less than the effect of the parasitical gate-to-source capacitance (i.e., "C1" and "C2") as shown in FIG. 3. The value of Vp2 (as shown in FIG. 8) is determined by Equation (3):

$$V_{p2} = 0.5 \cdot A_{v2} \cdot V_{in} \quad (3)$$

Av2 is the gain of differential amplifier 521, which is, for example, approximately 10 dB. Therefore, the coupling effect from Vin is determined as follows by Equations (4) and (5):

$$\Delta V_{out} = \Delta V_{p2} \cdot \frac{Cgd}{Cgd + Csmp} \quad (4)$$

$$= \frac{A_{v2} \cdot \Delta V_{in} \cdot Cgd}{2 \cdot (Cgd + Csmp)} \quad (5)$$

Since the gate-to-drain parasitical capacitance Cgd is significantly less than the capacitance of sampling capacitor 535 (i.e., "Csmp"), the capacitance coupling effect (i.e., "ΔVout" of Equation (4)) is much less than the capacitance coupling effect of a single-end peak detector (i.e., "ΔVout" of Equation (1)).

Referring now to FIGS. 10A-10G, various exemplary implementations of the present invention are shown. Referring to FIG. 10A, the present invention may be embodied as a differential peak detector in a hard disk drive 1500. The present invention may implement either or both signal processing and/or control circuits, which are generally identified in FIG. 10A at 1502. In some implementations, signal processing and/or control circuit 1502 and/or other circuits (not shown) in HDD 1500 may process data, perform coding and/or encryption, perform calculations, and/or format data that is output to and/or received from a magnetic storage medium 1506.

HDD 1500 may communicate with a host device (not shown) such as a computer, mobile computing devices such as personal digital assistants, cellular phones, media or MP3 players and the like, and/or other devices via one or more wired or wireless communication links 1508. HDD 1500 may be connected to memory 1509, such as random access memory (RAM), a low latency nonvolatile memory such as flash memory, read only memory (ROM) and/or other suitable electronic data storage.

Referring now to FIG. 10B, the present invention may be embodied as a differential peak detector in a digital versatile disc (DVD) drive 1510. The present invention may implement either or both signal processing and/or control circuits, which are generally identified in FIG. 10B at 1512, and/or mass data storage 1518 of DVD drive 1510. Signal processing and/or control circuit 1512 and/or other circuits (not shown) in DVD 1510 may process data, perform coding and/or encryption, perform calculations, and/or format data that is read from and/or data written to an optical storage medium 1516. In some implementations, signal processing and/or control circuit 1512 and/or other circuits (not shown) in DVD 1510 can also perform other functions such as encoding and/or decoding and/or any other signal processing functions associated with a DVD drive.

DVD drive 1510 may communicate with an output device (not shown) such as a computer, television or other device via one or more wired or wireless communication links 1517. DVD 1510 may communicate with mass data storage 1518 that stores data in a nonvolatile manner. Mass data storage 1518 may include a hard disk drive (HDD) such as that shown in FIG. 10A. The HDD may be a mini HDD that includes one or more platters having a diameter that is smaller than approximately 1.8". DVD 1510 may be connected to memory 1519, such as RAM, ROM, low latency nonvolatile memory such as flash memory, and/or other suitable electronic data storage.

Referring now to FIG. 10C, the present invention may be embodied as a differential peak detector in a high definition television (HDTV) 1520. The present invention may implement either or both signal processing and/or control circuits, which are generally identified in FIG. 10C at 1522, a WLAN interface and/or mass data storage of the HDTV 1520. HDTV 1520 receives HDTV input signals in either a wired or wireless format and generates HDTV output signals for a display 1526. In some implementations, signal processing circuit and/or control circuit 1522 and/or other circuits (not shown) of HDTV 1520 may process data, perform coding and/or encryption, perform calculations, format data and/or perform any other type of HDTV processing that may be required.

HDTV 1520 may communicate with mass data storage 1527 that stores data in a nonvolatile manner such as optical and/or magnetic storage devices. At least one HDD may have the configuration shown in FIG. 10A and/or at least one DVD may have the configuration shown in FIG. 10B. The HDD may be a mini HDD that includes one or more platters having a diameter that is smaller than approximately 1.8"HDTV 1520 may be connected to memory 1528 such as RAM, ROM, low latency nonvolatile memory such as flash memory and/or other suitable electronic data storage. HDTV 1520 also may support connections with a WLAN via a WLAN network interface 1529.

Referring now to FIG. 10D, the present invention may be embodied as a differential peak detector in a control system of a vehicle 1530, a WLAN interface and/or mass data storage of the vehicle control system. In some implementations, the present invention implements a powertrain control system 1532 that receives inputs from one or more sensors such as temperature sensors, pressure sensors, rotational sensors, airflow sensors and/or any other suitable sensors and/or that generates one or more output control signals such as engine operating parameters, transmission operating parameters, and/or other control signals.

The present invention may also be embodied in other control systems 1540 of vehicle 1530. Control system 1540 may likewise receive signals from input sensors 1542 and/or output control signals to one or more output devices 1544. In some implementations, control system 1540 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations are contemplated.

Powertrain control system 1532 may communicate with mass data storage 1546 that stores data in a nonvolatile manner. Mass data storage 1546 may include optical and/or magnetic storage devices for example hard disk drives HDD and/or DVDs. At least one HDD may have the configuration shown in FIG. 10A and/or at least one DVD may have the configuration shown in FIG. 10B. The HDD may be a mini HDD that includes one or more platters having a diameter that is smaller than approximately 1.8". Powertrain control system 1532 may be connected to memory 1547 such as RAM, ROM, low latency nonvolatile memory such as flash memory and/or other suitable electronic data storage. Powertrain control system 1532 also may support connections with a WLAN via a WLAN network interface 1548. The control system 1540 may also include mass data storage, memory and/or a WLAN interface (all not shown).

Referring now to FIG. 10E, the present invention may be embodied as a differential peak detector in a cellular phone 1550 that may include a cellular antenna 1551. The present invention may implement either or both signal processing and/or control circuits, which are generally identified in FIG. 10E at 1552, a WLAN interface and/or mass data storage of the cellular phone 1550. In some implementations, cellular phone 1550 includes a microphone 1556, an audio output 1558 such as a speaker and/or audio output jack, a display 1560 and/or an input device 1562 such as a keypad, pointing device, voice actuation and/or other input device. Signal processing and/or control circuits 1552 and/or other circuits (not shown) in cellular phone 1550 may process data, perform coding and/or encryption, perform calculations, format data and/or perform other cellular phone functions.

Cellular phone 1550 may communicate with mass data storage 1564 that stores data in a nonvolatile manner such as optical and/or magnetic storage devices for example hard disk drives HDD and/or DVDs. At least one HDD may have the configuration shown in FIG. 10A and/or at least one DVD may have the configuration shown in FIG. 10B. The HDD may be a mini HDD that includes one or more platters having a diameter that is smaller than approximately 1.8". Cellular phone 1550 may be connected to memory 1566 such as RAM, ROM, low latency nonvolatile memory such as flash memory and/or other suitable electronic data storage. Cellular phone 1550 also may support connections with a WLAN via a WLAN network interface 1568.

Referring now to FIG. 10F, the present invention may be embodied as a differential peak detector in a set top box 1580. The present invention may implement either or both signal processing and/or control circuits, which are generally identified in FIG. 10F at 1584, a WLAN interface and/or mass data storage of the set top box 1580. Set top box 1580 receives signals from a source such as a broadband source and outputs standard and/or high definition audio/video signals suitable for a display 1588 such as a television and/or monitor and/or other video and/or audio output devices. Signal processing and/or control circuits 1584 and/or other circuits (not shown) of the set top box 1580 may process data, perform coding and/or encryption, perform calculations, format data and/or perform any other set top box function.

Set top box 1580 may communicate with mass data storage 1590 that stores data in a nonvolatile manner. Mass data storage 1590 may include optical and/or magnetic storage devices for example hard disk drives HDD and/or DVDs. At least one HDD may have the configuration shown in FIG. 10A and/or at least one DVD may have the configuration shown in FIG. 10B. The HDD may be a mini HDD that includes one or more platters having a diameter that is smaller than approximately 1.8". Set top box 1580 may be connected to memory 1594 such as RAM, ROM, low latency nonvolatile memory such as flash memory and/or other suitable electronic data storage. Set top box 1580 also may support connections with a WLAN via a WLAN network interface 1596.

Referring now to FIG. 10G, the present invention may be embodied as a differential peak detector in a media player 600. The present invention may implement either or both signal processing and/or control circuits, which are generally identified in FIG. 10G at 604, a WLAN interface and/or mass data storage of the media player 600. In some implementations, media player 600 includes a display 607 and/or a user input 608 such as a keypad, touchpad and the like. In some implementations, media player 600 may employ a graphical user interface (GUI) that typically employs menus, drop down menus, icons and/or a point-and-click interface via display 607 and/or user input 608. Media player 600 further includes an audio output 609 such as a speaker and/or audio output jack. Signal processing and/or control circuits 604 and/or other circuits (not shown) of media player 600 may process data, perform coding and/or encryption, perform calculations, format data and/or perform any other media player function. Media player 600 may communicate with mass data storage 610 that stores data such as compressed audio and/or video content in a nonvolatile manner. In some implementations, the compressed audio files include files that are compliant with MP3 format or other suitable compressed audio and/or video formats. The mass data storage may include optical and/or magnetic storage devices for example hard disk drives HDD and/or DVDs. At least one HDD may have the configuration shown in FIG. 10A and/or at least one DVD may have the configuration shown in FIG. 10B. The HDD may be a mini HDD that includes one or more platters having a diameter that is smaller than approximately 1.8". Media player 600 may be connected to memory 614 such as RAM, ROM, low latency nonvolatile memory such as flash memory and/or other suitable electronic data storage. Media player 600 also may support connections with a WLAN via a WLAN network interface 616. Still other implementations in addition to those described above are contemplated.

The invention has been described above with respect to particular illustrative embodiments. It is understood that the invention is not limited to the above-described embodiments and that various changes and modifications may be made by those skilled in the relevant art without departing from the spirit and scope of the invention.

What is claimed is:

1. A differential peak detector for outputting an output signal indicative of a peak value of an input signal, comprising:
   a sampling capacitor across which the output signal is provided;
   a differential amplifier with common mode feedback, for differential amplification of the input signal and for output of a common mode output whose common mode level is substantially the same as a common mode voltage;
   first and second common source input pairs, wherein the common mode output of said differential amplifier is coupled to input of said first common source input pair, and wherein the common mode voltage and a feedback from the output signal across said sampling capacitor are coupled to input of said second common source input pair;
   a transconductance stage whose input is coupled to respective outputs of said first and second common source input pairs, wherein an output of said transconductance stage controls charging of said sampling capacitor.

2. A differential peak detector according to claim 1, wherein said differential amplifier has a gain approximating one and a high bandwidth.

3. A differential peak detector according to claim 1, further comprising a current mirror driven by the output of said transconductance stage, the current mirror providing a charging current for charging said sampling capacitor.

4. A differential peak detector according to claim 3, wherein said current mirror comprises:
   a first transistor coupled with the output of said transconductance stage and a voltage supply; and
   a second transistor coupled with the output of said transconductance stage and said sampling capacitor.

5. A differential peak detector according to claim 1, wherein said transconductance stage comprises NMOS input pairs.

6. A differential peak detector according to claim 1, further comprising a reset switch for resetting said sampling capacitor to an initial value.

7. A differential peak detector according to claim 1, wherein said first common source input pair comprises NMOS input pairs, and said second common source input pair comprises NMOS input pairs.

8. A differential peak detector according to claim 7, wherein the respective outputs of said first and second common source input pairs are added through addition of current, wherein currents of positive outputs of said first and second common source input pairs flow through a positive input of said transconductance stage, and currents of negative outputs of said first and second common source input pairs flow through a negative input of said transconductance stage.

9. A differential peak detector according to claim 7, wherein said first and second common source input pairs further comprise loading resistors composed of polysilicon.

10. A differential peak detector according to claim 1, wherein said first and second common source input pairs have a bandwidth of at least approximately twice a dominant pole frequency of the input signal.

11. A differential peak detector according to claim 1, wherein the gain of said first and second common source input pairs is approximately 10 dB.

12. A differential peak detector according to claim 1, further comprising a multiplexer (MUX) for generating the input signal for input to the differential amplifier, the MUX comprising a signal input coupled to a MUX input signal, a common mode voltage input coupled to the common mode voltage, a positive output coupled to a positive input of said differential amplifier, and a negative output coupled to a negative input of said differential amplifier.

13. A differential peak detector according to claim 12, said multiplexer includes at least four multiplexing modes including:
   a first mode, wherein if a signal coupled to the signal input is of type single-end positive peaking, the positive output outputs the signal, and the negative output outputs the common mode voltage;
   a second mode, wherein if the signal coupled to the signal input is of type single-end negative peaking, the negative output outputs the signal, and the positive output outputs the common mode voltage;

a third mode, wherein if the signal coupled to the signal input is of type differential positive peaking, the positive output outputs a positive component of the signal, and the negative output outputs a negative component of the signal; and a fourth mode, wherein if the signal coupled to the signal input is of type differential negative peaking, the negative output outputs a positive component of the signal, and the positive output outputs a negative component of the signal.

14. A method for outputting an output signal indicative of a peak value of an input signal, comprising:

a sampling step for providing the output signal across a sampling capacitor;

a differential amplifying step of differentially amplifying the input signal using common mode feedback and outputting a common mode output whose common mode level is substantially the same as a common mode voltage;

a first common source inputting step of coupling the common mode output of the differential amplification to an input of a first common source input pair;

a second common source inputting step of coupling the common mode voltage and a feedback from the output signal across the sampling capacitor to an input of a second common source input pair;

a transconducting step of coupling respective outputs of the first and second common source input steps to an input of a transconductance stage, wherein an output of said transconducting step controls charging of said sampling capacitor.

15. The method according to claim 14, wherein the respective outputs of said first and second common source input steps are added through addition of current, wherein currents of positive outputs of said first and second common source input steps flow through a positive input of said transconductance stage, and currents of negative outputs of said first and second common source input steps flow through a negative input of said transconductance stage.

16. The method according to claim 14, further comprising a multiplexing step for generating the input signal for input to the differential amplifying step, the MUX comprising a signal input coupled to a MUX input signal, a common mode voltage input coupled to the common mode voltage, a positive output coupled to a positive input of said differential amplifying step, and a negative output coupled to a negative input of said differential amplifying step.

17. The method according to claim 16, wherein said multiplexing step includes selecting at least one of at least four multiplexing modes, the at least four multiplexing modes including:

a first mode, wherein if a signal coupled to the signal input is of type single-end positive peaking, the positive output outputs the signal, and the negative output outputs the common mode voltage;

a second mode, wherein if the signal coupled to the signal input is of type single-end negative peaking, the negative output outputs the signal, and the positive output outputs the common mode voltage;

a third mode, wherein if the signal coupled to the signal input is of type differential positive peaking, the positive output outputs a positive component of the signal, and the negative output outputs a negative component of the signal; and a fourth mode, wherein if the signal coupled to the signal input is of type differential negative peaking, the negative output outputs a positive component of the signal, and the positive output outputs a negative component of the signal.

* * * * *